(12) United States Patent
Chen et al.

(10) Patent No.: US 6,171,732 B1
(45) Date of Patent: Jan. 9, 2001

(54) METHOD OF MANUFACTURING AND APPLICATION OF DUAL ALIGNMENT PHOTOMASK

(75) Inventors: Chih-Rong Chen, Hsinchu; Wen-Yuan Huang, Hsinchu Hsien, both of (TW)

(73) Assignee: United Microelectronics Corp. (TW)

( * ) Notice: Under 35 U.S.C. 154(b), the term of this patent shall be extended for 0 days.

(21) Appl. No.: 09/304,627

(22) Filed: May 4, 1999

(51) Int. Cl.[7] .................................................. G03F 9/00
(52) U.S. Cl. ................................................................ 430/5
(58) Field of Search ........................... 430/5; 438/401, 438/975; 216/12

(56) References Cited

U.S. PATENT DOCUMENTS 5,666,176 * 9/1997 Kwrematsu et al. .................. 349/95
5,872,042 * 2/1999 Hsu et al. ............................. 438/401
5,904,563 * 5/1999 Yu ....................................... 438/672

* cited by examiner

Primary Examiner—Shean C. Wu
(74) Attorney, Agent, or Firm—Martine Penilla & Kim, LLP

(57) ABSTRACT

A method of forming a dual alignment photomask. The method includes the steps of depositing a light-blocking layer over a glass plate, and then patterning the light-blocking layer. Next, a switchable mask layer is deposited over the light-blocking layer and the glass plate, after which the switchable mask layer is patterned. Finally, a protective layer is formed over the switchable mask layer, the light-blocking layer and the glass plate. The switchable mask layer can be changed from a light-passing state to a light-blocking state by simply changing the surrounding temperature. Therefore, through proper setting the temperature, the same photomask can be used to form trenches and vias of dual damascene structures. Thus, some mask-making cost can be saved and errors due to mask misalignment can be avoided.

18 Claims, 8 Drawing Sheets

METHOD OF MANUFACTURING AND APPLICATION OF DUAL ALIGNMENT PHOTOMASK

BACKGROUND OF THE INVENTION

1. Field of Invention

The present invention relates to a method of manufacturing and an application of a dual alignment photomask. More particularly, the present invention relates to a method of manufacturing a dual alignment photomask and a method of forming a dual damascene structure using only one dual alignment photomask.

2. Description of Related Art

Conventionally, two photolithographic operations using two different photomasks have to be conducted to form a dual damascene structure. One photomask is used for forming the metal trench lines, while the other photomask is used for forming the metal vias.

FIGS. 1A through 1F are schematic, cross-sectional views showing the progression of steps in producing a conventional dual damascene structure. First, as shown in FIG. 1A, a semiconductor substrate (not shown in the figure) is provided. The semiconductor substrate has a first inter-metal dielectric layer 12, a silicon nitride (SiN) layer 14 and a second inter-metal dielectric layer 16 formed on top. The silicon nitride layer 14 serves an etching stop layer that prevents the over-etching of material during the metal trench line etching operation.

Next, as shown in FIG. 1B, a photoresist layer 18 is formed over the second inter-metal dielectric layer 16 using a special photomask (not shown). Then, the second inter-metal dielectric layer 16 is etched to form metal trench lines 20 and 22 (shown as a U-shaped cut in the cross-sectional diagram). Thereafter, the photoresist layer 18 is removed forming a structure as shown in FIG. 1C.

As shown in FIG. 1D, another photoresist layer 24 is formed over the second inter-metal dielectric layer 16 again using another special photomask (not shown). Then, a portion of the silicon nitride layer 14 and the first inter-metal dielectric layer 12 are etched to form a via 26 within the metal trench line region 20. Subsequently, metal is deposited, filling the via 26 and the metal trench lines 20 and 22, to form a metallic layer 28 as shown in FIG. 1E. Finally, excess metal above the second inter-metal dielectric layer 16 is removed using, for example, a chemical-mechanical polishing (CMP) method. The remaining portions of metallic layer 28a have a planar upper surface as shown in FIG. 1F.

In the aforementioned operation, the dual damascene structure requires two etching operations using two different photomasks. This not only increases the production cost, but also increases incidence of mask misalignment. Any mask misalignment contributes to processing errors that may ultimately lower the reliability of devices.

Furthermore, although using the silicon nitride layer as an etching stop layer is able to prevent over-etching, the deposition of a silicon nitride layer on top of an inter-metal dielectric layer can lead to additional film compression stresses. Together with film tensile stresses produced by the silicon dioxide of the inter-metal dielectric layer, these stresses are capable of producing cracks or discontinuity along the sidewalls of the vias. In addition, the silicon nitride layer can affect the ultimate width of the via after an etching operation, and hence may lead to variation and instability of device resistance.

In light of the foregoing, there is a need to reduce the number of mask-making operations as well as to improve the processing steps needed to carry out for forming the dual damascene structure.

SUMMARY OF THE INVENTION

Accordingly, the purpose of the present invention is to provide a method of forming a dual alignment photomask and illustrate how the same photomask can be used to form metal trench lines and metal vias of a dual damascene structure. Hence, severe discrepancies due to mask misalignment can be prevented and cost of production can be decreased. Moreover, the silicon nitride layer is no longer needed, and therefore, possible formation of cracks or discontinuities along the sidewalls of the vias can be avoided.

To achieve these and other advantages and in accordance with the purpose of the invention, as embodied and broadly described herein, the invention provides a method of forming a dual alignment photomask. The method includes the steps of depositing a blocking layer over a glass plate, and then patterning the light-blocking aye Next, a switchable mask layer is deposited over the light-blocking layer and the glass plate, and then the switchable mask layer is patterned. Finally, a protective layer is formed over the switchable mask layer, the light-blocking layer and the glass plate.

According to this invention, the light-blocking layer can be a chromium layer. The switchable mask layer can be a liquid crystal layer whose degree of transparency depends on temperature (for example, switching at about 29.9° C.). As soon as the surrounding temperature exceeds the phase-switching temperature, the liquid crystal blocks incoming light. On the other hand, if the surrounding temperature falls below the phase-switching temperature, the liquid crystal permits incoming light to pass through. Furthermore, the optimal light-passing state of liquid crystal material can be enhanced by a magnetic or an electric field.

This invention also provides a method of using the dual alignment photomask to fabricate a dual damascene structure. The method includes the steps of forming a photoresist layer over an inter-metal dielectric layer, and then aligning the dual alignment photomask on top of a photoresist layer. Then, the photoresist layer is exposed to light with the surrounding temperature above the phase-switching temperature of the liquid crystal material. Next, the photoresist layer is developed to form a via in the photoresist layer. Thereafter, the surrounding temperature is lowered to a temperature below the phase-switching temperature of the liquid crystal material and then exposing the photoresist layer through the photomask again. Hence, a trench is formed in the photoresist layer. After that, the inter-metal dielectric layer is etched to form a trench/via structure or a trench structure in the inter-metal dielectric layer using the patterned photoresist layer as an etching mask. Finally, metal is deposited into the via/trench structure and trench structure of the inter-metal dielectric layer.

An alternative method of using the dual alignment photomask to form a dual damascene structure is to expose the photoresist layer through the photomask at a temperature below the phase-switching temperature so that trenches are formed after development. Next, the photoresist layer is exposed to light through the same photomask at a temperature above the phase-switching temperature, and then the photoresist layer is developed to form a via within the trench line region. Finally, the same operations needed to form a complete damascene structure are performed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
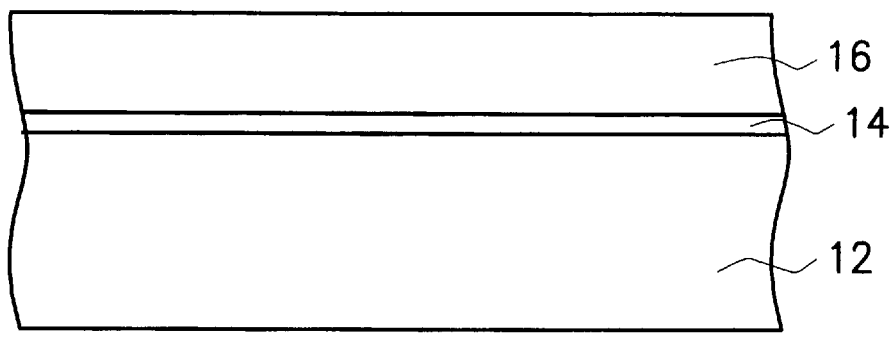
FIGS. 1A through 1F are schematic, cross-sectional views showing the progression of steps in producing a conventional dual damascene structure.
Figure 1B:
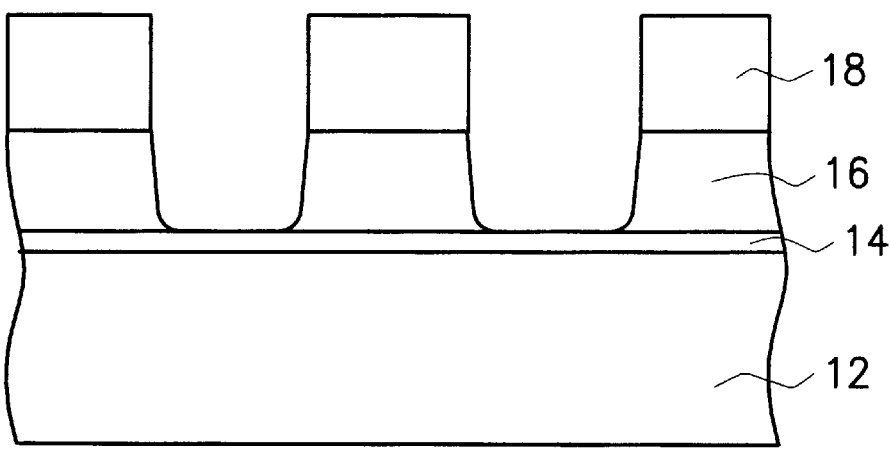
Figure 1C:
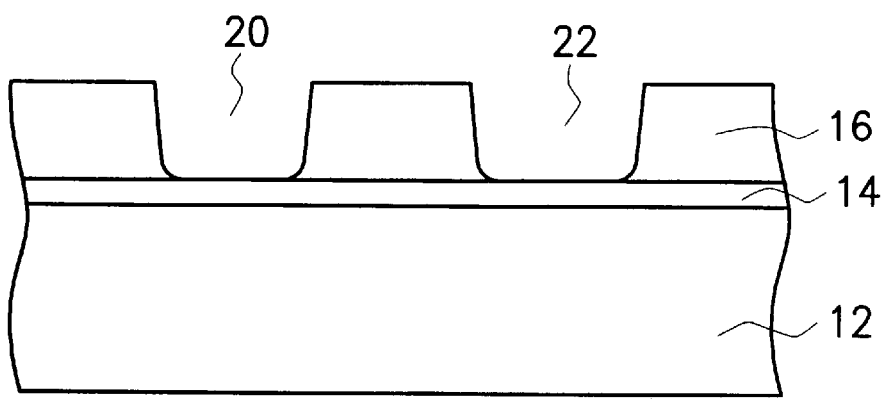
Figure 1D:
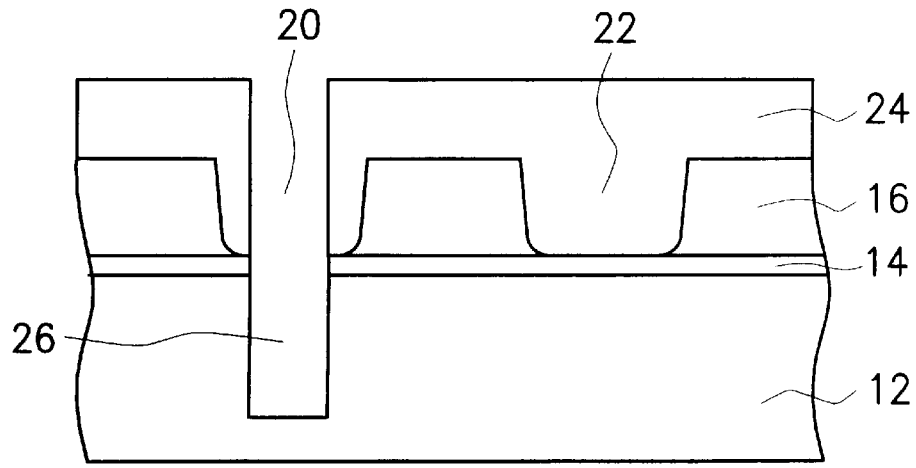
Figure 1E:
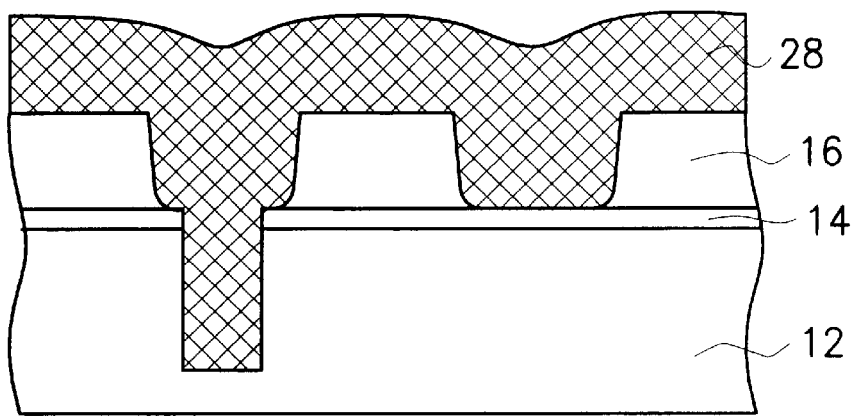
Figure 1F:
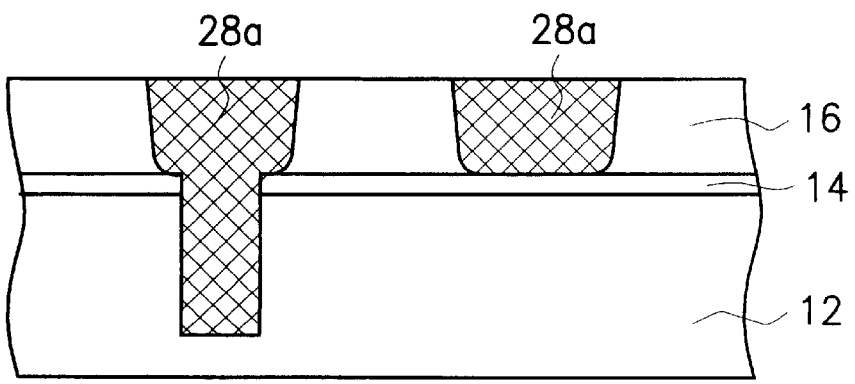

Reference will now be made in detail to the present preferred embodiments of the invention, examples of which are illustrated in the accompanying drawings. Wherever possible, the same reference numbers are used in the drawings and the description to refer to the same or like parts.

Figure 2:
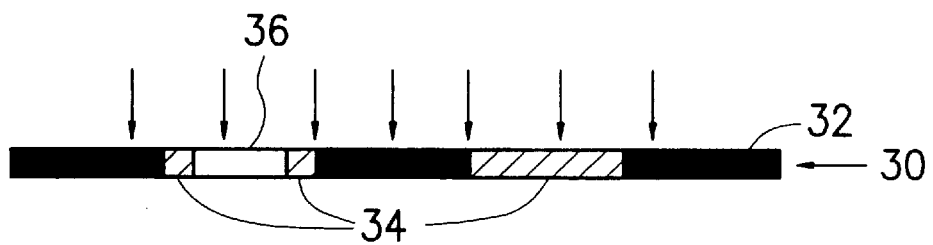
FIG. 2 is a schematic, cross-sectional side view of a dual alignment photomask according to one preferred embodiment of this invention, FIG. 3 sketches out the isotropic phase crystals within the switchable mask layer of the dual alignment photomask at a temperature above the phase-switching temperature.

FIG. 2 is a schematic, cross-sectional side view of a dual alignment photomask according to one preferred embodiment of this invention.

Figure 3:
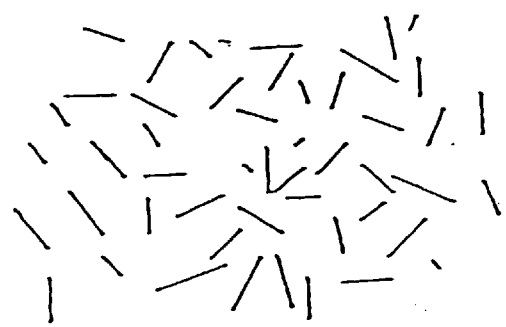
Figure 4:
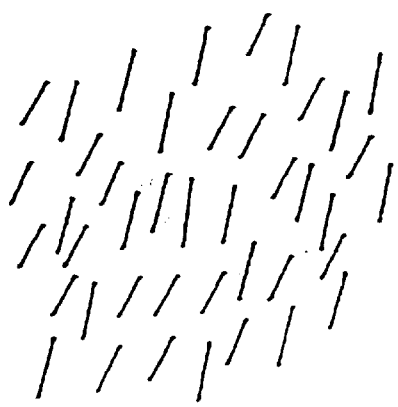
FIG. 4 sketches out the nematic phase crystals within the switchable mask layer of the dual alignment photomask at a temperature below the phase-switching temperature.

In FIG. 2, the dual alignment photomask 30 comprises a light-blocking portion 32 (colored black), a switchable mask portion 34 (with diagonal lines) and a light-passing portion 36 (entirely blank). The switchable mask portion 34 is made from, for example, a liquid crystal (formal chemical name is 4-4n-hexyl-cyano bipheny). The liquid crystal has a characteristic transition or phase-switching temperature, for example, at about 29.9° C., such that there is a phase change whenever the phase-switching temperature is crossed. FIG. 3 sketches out the isotropic phase crystals within the switchable mask layer of the dual alignment photomask at a temperature above the phase-switching temperature. In the isotropic phase, light cannot pass through the liquid crystal. FIG. 4 sketches out the nematic phase crystals within the switchable mask layer of the dual alignment photomask at a temperature below the phase-switching temperature. In the nematic phase, light is permitted to go through the liquid crystal. Liquid crystal has a high sensitivity of about 0.01° C. around the phase-switching temperature. Furthermore, additional magnetic or electric field can be applied to produce the optimal light-passing capacity when the liquid crystal is in the nematic phase below the phase-switching temperature.

Figure 5A:
FIGS. 5A through 5C are schematic, cross-sectional views showing the series of steps in producing the dual alignment photomask of this invention.
Figure 5B:
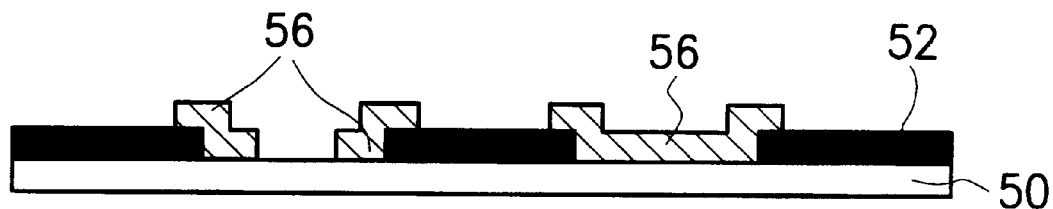
Figure 5C:
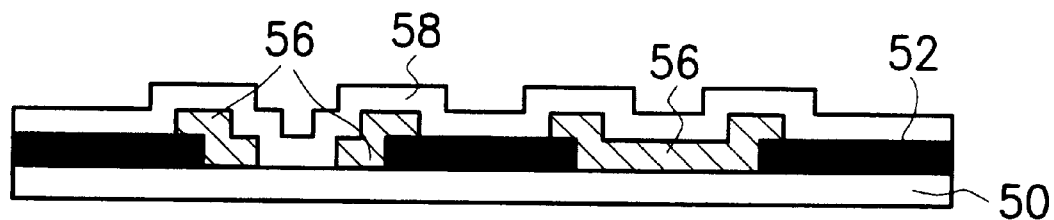

FIGS. 5A through 5C are schematic, cross-sectional views showing the series of steps taken in producing the dual alignment photomask of this invention. As shown in FIG. 5A, a light-blocking layer 52 (colored black) such as a chromium layer is deposited over a glass plate 50. The light-blocking layer 52 is etched to form a pattern containing the metal trench lines (openings 54 in the figure). Thereafter, a switchable mask layer is deposited over the light-blocking layer 52 and the glass plate 50, and then the switchable mask layer is patterned to form a structure as shown in FIG. 5B. The switchable mask layer includes the aforementioned liquid crystal material whose transparency to light can be changed according to the ambient temperature as well as an externally applied magnetic or electric field. Finally, a protective layer 58 is formed over the switchable mask layer 56, the light-blocking layer 52 and the glass plate 50. The protective layer is preferably a chromium dioxide layer.

Figure 6A:
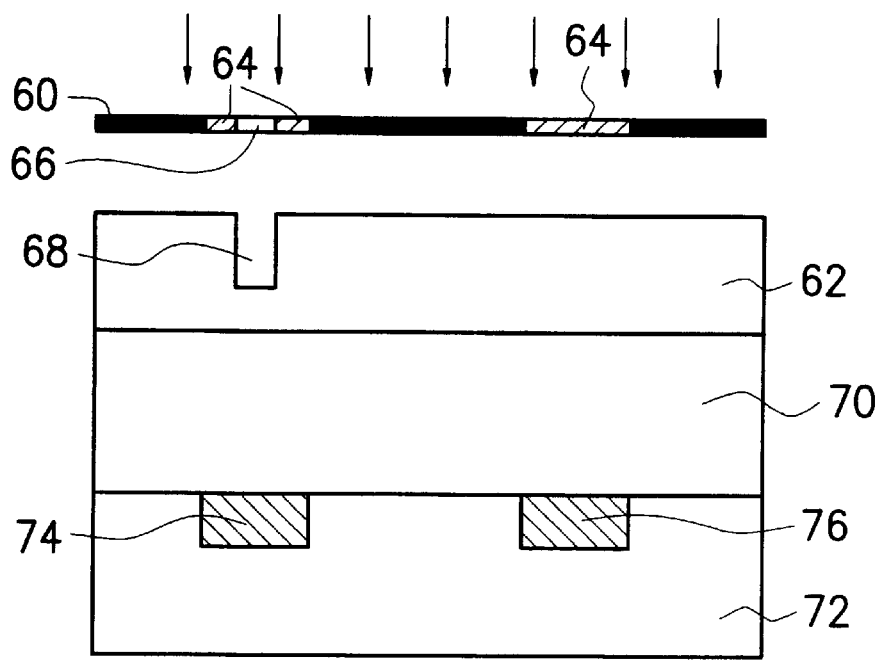
FIGS. 6A through 6D are schematic, cross-sectional views showing a series of steps in fabricating a dual damascene structure using the dual alignment photomask of his invention.

FIGS. 6A through 6D are cross-sectional views showing a series of steps for fabricating a dual damascene structure using the dual alignment photomask of this invention. As shown in FIG. 6A, a layered structure that includes a first metallic dielectric layer 72, a first metallic layer 74, a second metallic layer 76, a second metallic dielectric layer 70 and a photoresist layer 62 is provided. First, a dual alignment photomask 60 of this invention is mounted over a photoresist layer 62. Then, the photoresist layer 62 is exposed to light that passes through the photomask 60 after the surrounding temperature is raised to a level above the phase-switching temperature. Since the switchable mask layer 64 in the photomask is able to block light above the phase-switching temperature, light cannot pass therethrough into the photoresist layer 62. Only light passing through the light-passing layer 66 is able to pass through. Consequently, a via 68 is formed in the photoresist layer 62 after development.

Figure 6B:
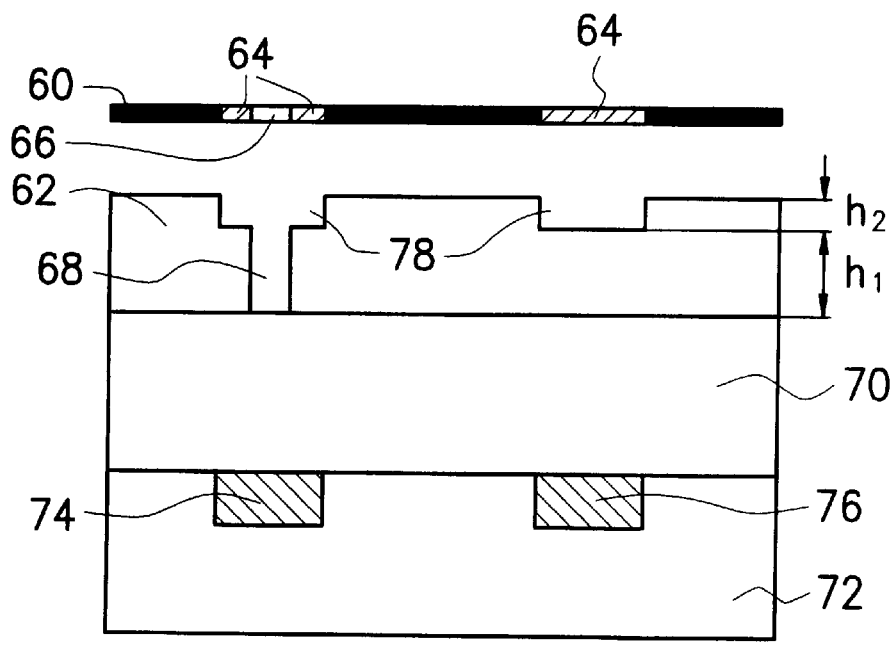

As shown in FIG. 6B, ambient temperature is lowered to a level below the phase-switching temperature of the switchable mask layer 64. Thereafter, the photoresist layer 62 is again exposed to light that passes through the photomask 60. Since both the switchable mask layer 64 and the light-passing layer 66 permit light to pass through, trenches 78 are formed in the photoresist layer 62 after development. Here, depth $h_1$ of the via 68 can be controlled in the first light exposure and depth $h_2$ of the trenches 78 can be controlled in the second light exposure. Therefore, profile distortion of the via 68 and the trenches 78 due to the absence of a protective nitride layer can be avoided. In addition, the degree of transparency of the switchable mask layer 64 can be adjusted by further application of a magnetic or an electric field.

Figure 6C:
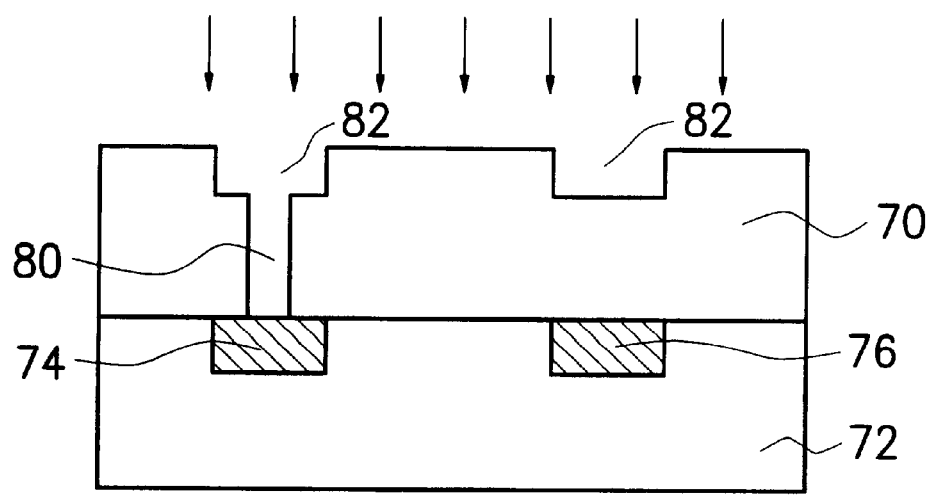
Figure 6D:
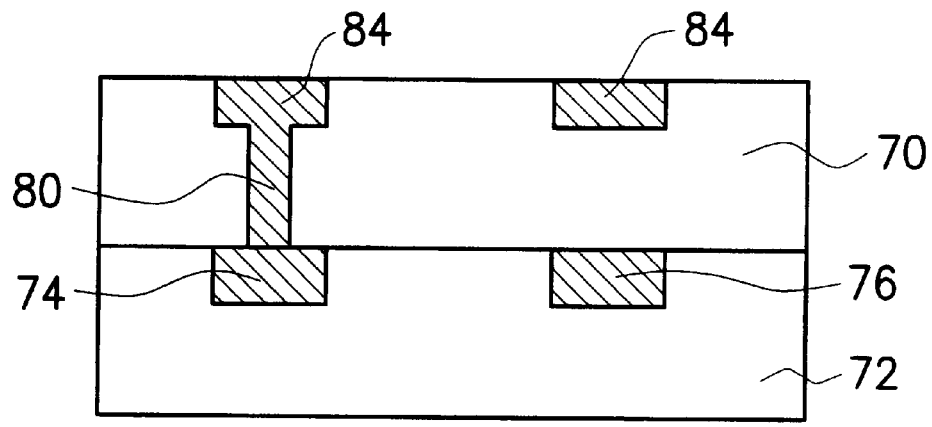

The second metallic dielectric layer 70 is etched using the photoresist layer 62 as an etching mask. Ultimately, a via 80 and trenches 82 are formed in the second metal dielectric layer 70 as shown in FIG. 6C. Because depth of the via and the trenches in the photoresist layer 62 can be precisely controlled, the via 80 is able to reach the first metallic layer 74 for forming an electrical connection. The second metallic layer 76, on the other hand, has a via (not shown) leading to it that can only be seen in a different cross section. Subsequently, metal 84 is deposited into the via 80 and the trenches 82 as shown in FIG. 6C. Finally, a chemical-mechanical polishing (CMP) operation is applied to planarize the metallic layer 84, thereby forming a structure as shown in FIG. 6D.

Figure 7A:
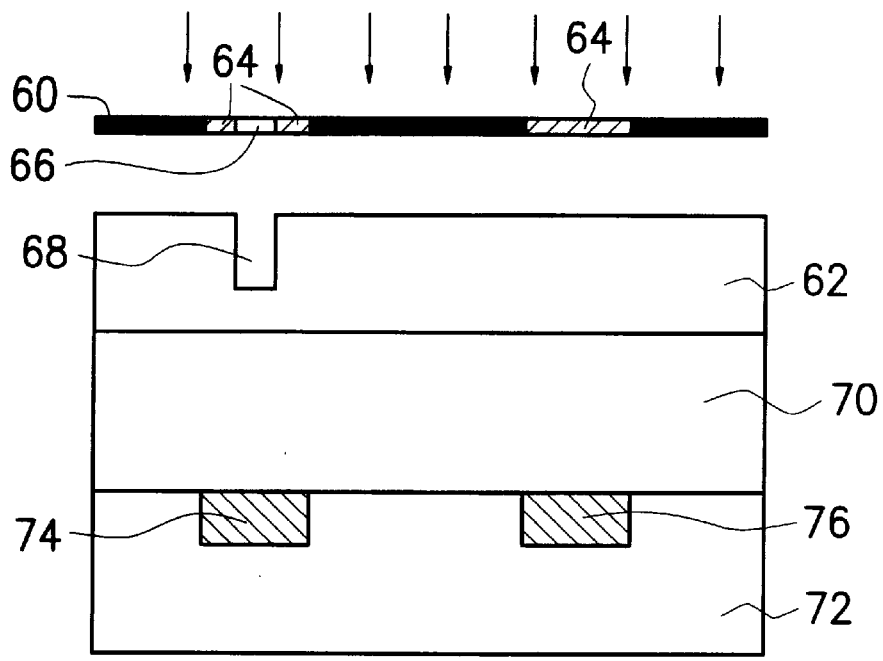
FIGS. 7A through 7D are schematic, cross-sectional views showing an alternative series of steps in fabricating a dual damascene structure using the dual alignment photomask of this invention.
Figure 7B:
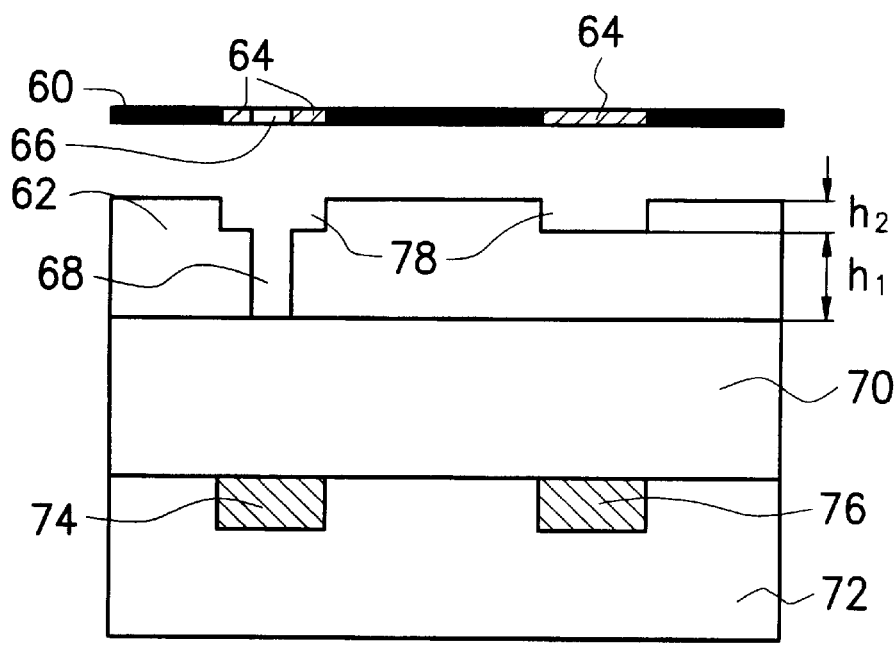
Figure 7C:
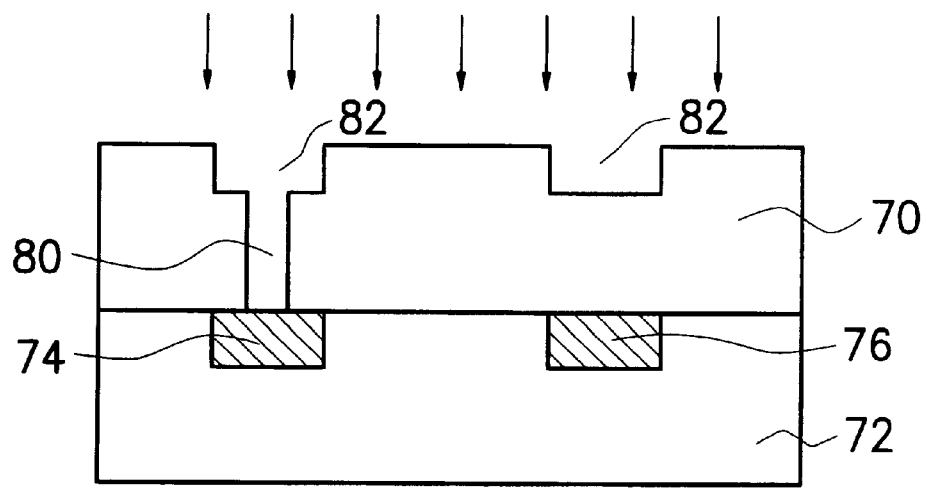

FIGS. 7A through 7D are schematic, cross-sectional views showing an alternative series of steps for fabricating a dual damascene structure, using the dual alignment photomask of this invention. Since most of the elements in FIGS. 7A through 7D are identical to the one shown in FIGS. 6A through 6D, they are labeled identically. As shown in FIG. 7A, the photoresist layer 62 is exposed to light that passes through the photomask 60 after the surrounding temperature is lowered to a level below the phase-switching temperature of the liquid crystal. Since both the switchable mask layer 64 and the light-passing layer 66 permit light to pass through, trenches 78 (FIG. 7B) are formed in the photoresist layer 62 after development.

Figure 7D:
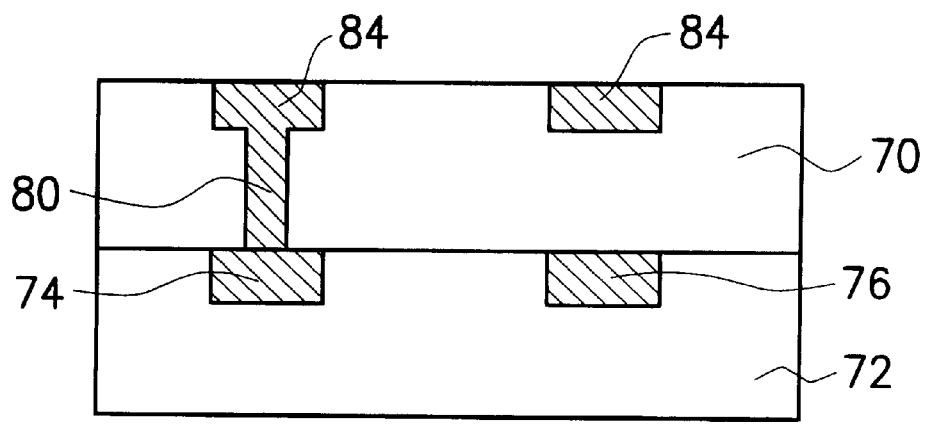

As shown in FIG. A, the surrounding temperature is increased to a level above the phase phase-switching temperature of the liquid crystal. The switchable mask layer 64 of the dual alignment photomask 60 now blocks off incoming light. Ultimately, a via 68 is formed within the trench 78 after the photoresist layer 62 is developed. Subsequently, similar to FIGS. 6C and 6D, metal 84 is deposited into the via 80 and the trenches 82 shown in FIG. 7C. Finally, a chemical-mechanical polishing (CMP) operation is applied to planarize the metallic layer 84, thereby forming a structure as shown in FIG. 7D.

In summary, one characteristic of this invention is the use of the same photomask to carry out trench and via forming operations, thereby preventing mask misalignment problems. Furthermore, since no silicon nitride layer is necessary, production cost is lowered. Moreover, cracks and discontinuities on the sidewalls of vias due to internal stresses as well as limitation of via width due to the presence of a silicon nitride layer are prevented. Hence, the value of resistance for a metallic via is more stable.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A method of manufacturing a dual alignment photomask, comprising the steps of
   providing a glass plate;
   forming a light-blocking layer over the glass plate;
   patterning the light-blocking layer;
   forming a switchable mask layer over the light-blocking layer and the glass plate;
   patterning the switchable mask layer; and
   forming a protective layer over the switchable mask layer, the light-blocking layer and the glass plate.
2. The method of claim 1, wherein the step of forming the light-blocking layer includes depositing chromium material to form a chromium layer.
3. The method of claim 1, wherein the step of forming the switchable mask layer includes depositing liquid crystal material to form a liquid crystal layer.
4. The method of claim 3, wherein the transparency of the liquid crystal material in the switchable mask layer can be altered by raising or lowering the temperature to a level above or below a phase-switching temperature in such a way that when the temperature is above the phase-switching temperature, light is blocked by the liquid crystal, but when the temperature is below the phase-switching temperature, light is permitted to pass through.
5. The method of claim 4, wherein the phase-switching temperature is around 29.9° C.
6. The method of claim 4, wherein transparency of light through the liquid crystal can be enhanced by the addition of a magnetic field.
7. The method of claim 4, wherein transparency of light through the liquid crystal can be enhanced by the addition of an electric field.
8. The method of claim 1, wherein the step of forming the protective layer includes depositing a chromium dioxide layer.
9. An application of a dual alignment photomask to form a dual damascene structure, comprising the steps of:
   mounting a patterned dual alignment photomask over a photoresist layer and then exposing the photoresist layer to light at a temperature above the phase-switching temperature, so that a via forms in the photoresist layer after development;
   lowering the temperature to a level below the phase-switching temperature and then shining light onto the photoresist layer through the photomask again, so that a trench forms in the photoresist layer after development;
   etching an inter-metal dielectric layer using the developed photoresist layer to form a via and a trench in the inter-metal dielectric layer; and
   depositing metal into the via and the trench of the inter-metal dielectric layer.
10. The application of claim 9, wherein the dual alignment photomask contains liquid crystal material such that when the temperature is above the phase-switching temperature, light is blocked by the liquid crystal, but when the temperature is below the phase-switching temperature, light is permitted to pass through the liquid crystal.
11. The application of claim 10, wherein the phase-switching temperature of the liquid crystal is around 29.9° C.
12. The application of claim 10, wherein transparency of light through the liquid crystal can be enhanced by the addition of a magnetic field.
13. The application of claim 10, wherein transparency of light through the liquid crystal can be enhanced by the addition of an electric field.
14. An application of a dual alignment photomask to form a dual damascene structure, comprising the steps of:
   mounting a patterned dual alignment photomask over a photoresist layer and then exposing the photoresist layer to light at a temperature below the phase-switching temperature, so that a trench forms in the photoresist layer after development;
   raising the temperature to a level above the phase-switching temperature and then shining light onto the photoresist layer through the photomask again, so that a via forms in the photoresist layer after development;
   etching an inter-metal dielectric layer using the developed photoresist layer to form a via and a trench in the inter-metal dielectric layer; and
   depositing metal into the via and the trench of the inter-metal dielectric layer.
15. The application of claim 14, wherein the dual alignment photomask contains liquid crystal material such that when the temperature is above the phase-switching temperature, light is blocked by the liquid crystal, but when the temperature is below the phase-switching temperature, light is permitted to pass through the liquid crystal.
16. The application of claim 15, wherein the phase-switching temperature of the liquid crystal is around 29.9° C.
17. The application of claim 15, wherein transparency of light through the liquid crystal can be enhanced by the addition of a magnetic field.
18. The application of claim 15, wherein transparency of light through the liquid crystal can be enhanced by the addition of an electric field.

* * * * *